United States Patent
Sun et al.

(10) Patent No.: US 7,573,716 B2
(45) Date of Patent: Aug. 11, 2009

(54) BOLSTER PLATE ASSEMBLY FOR PRINTED CIRCUIT BOARD

(75) Inventors: Ke Sun, Shenzhen (CN); Zhen-Xing Ye, Shenzhen (CN); Ming-Ke Chen, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 62 days.

(21) Appl. No.: 11/946,854

(22) Filed: Nov. 29, 2007

(65) Prior Publication Data

US 2009/0059530 A1  Mar. 5, 2009

(30) Foreign Application Priority Data

Aug. 31, 2007  (CN) .................... 2007 1 0201572

(51) Int. Cl.
*H05K 7/20* (2006.01)

(52) U.S. Cl. .......... 361/719; 361/704; 361/710; 257/718; 257/727; 165/80.3; 174/16.3

(58) Field of Classification Search .............. None
See application file for complete search history.

(56) References Cited

U.S. PATENT DOCUMENTS

| 6,430,050 | B1 | 8/2002 | Hensley et al. | |
| 6,480,388 | B1* | 11/2002 | Lee et al. | 361/704 |
| 6,625,022 | B2* | 9/2003 | Frutschy et al. | 361/700 |
| 6,646,881 | B1* | 11/2003 | Lai et al. | 361/719 |
| 7,170,750 | B2* | 1/2007 | Tanaka | 361/719 |
| 2007/0047211 | A1* | 3/2007 | Refai-Ahmed et al. | 361/720 |
| 2007/0121300 | A1* | 5/2007 | Xia et al. | 361/719 |

* cited by examiner

*Primary Examiner*—Boris L Chervinsky
(74) *Attorney, Agent, or Firm*—Frank R. Niranjan

(57) ABSTRACT

A bolster plate assembly for a printed circuit board includes a first structure member, a second structure member rotatably mounted to the first structure member, and a plurality of locking members. Two spaced, elongated sliding slots are defined in the first structure member. Two spaced, elongated sliding slots are defined in the second structure member. The locking members are slidably attached in the sliding slots of the first and second structure members.

15 Claims, 5 Drawing Sheets

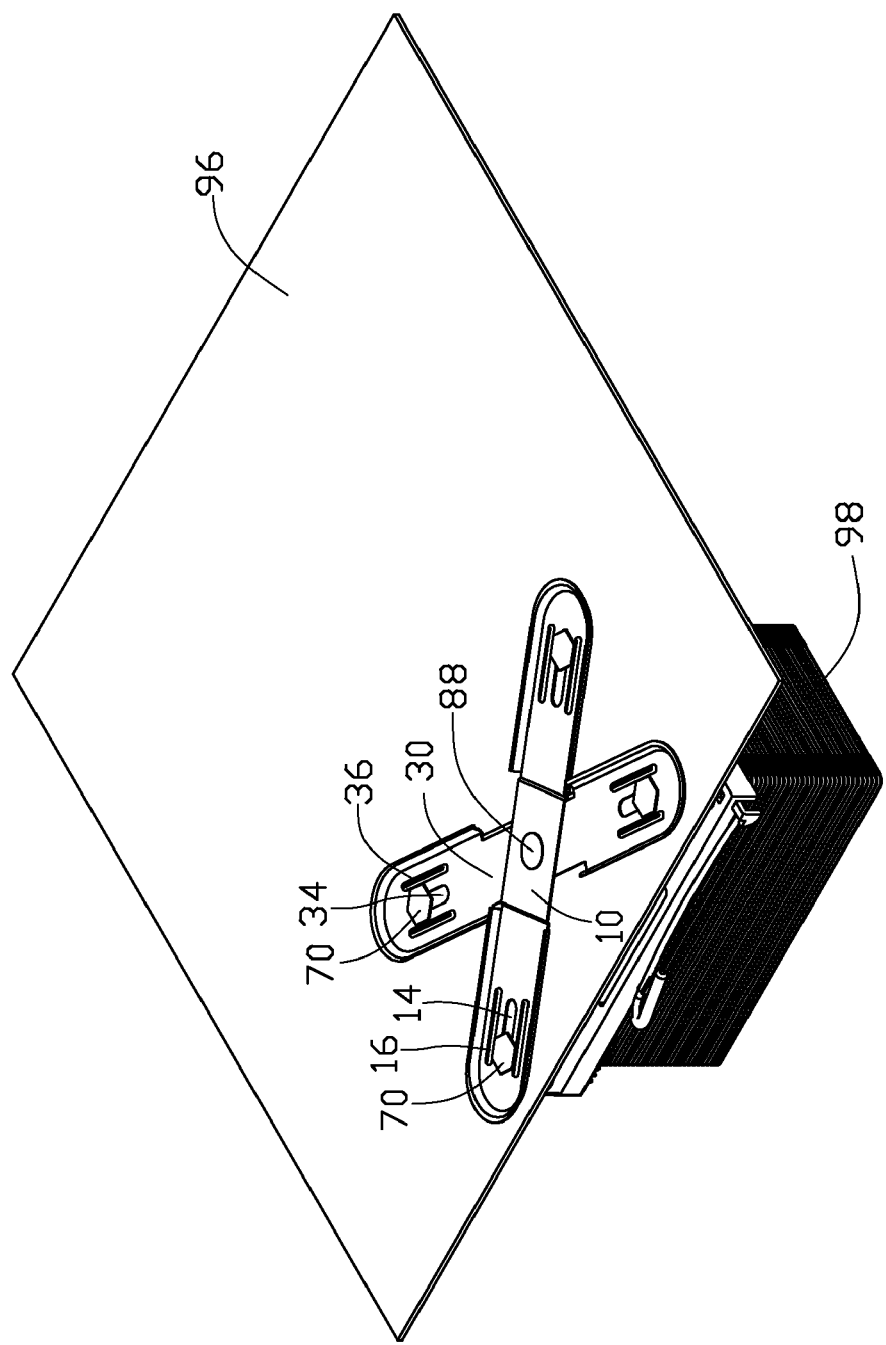

BOLSTER PLATE ASSEMBLY FOR PRINTED CIRCUIT BOARD

BACKGROUND

1. Field of the Invention

The present invention relates to a bolster plate assembly for a printed circuit board, and more particularly to a bolster plate assembly for reinforcing a printed circuit board.

2. Description of Related Art

As the state of development of semiconductor components such as central processing units (CPUs) has evolved towards higher level of integration, the amount of heat semiconductor components generate has significantly increased. The heat must be adequately and timely removed to prevent increased temperatures from damaging the semiconductor components. One approach for solving the heat dissipation problem is to attach heat dissipation devices, which transfer or dissipate heat by means of heat sinks, to printed circuit boards such as motherboards, on which CPUs are disposed. However, as CPUs get increasingly hotter, the heat dissipation devices required to cool these CPUs likewise get larger and heavier. Thus the risk of damage to the motherboards is increased due to mechanical overloading. Therefore, there is an increasing need to distribute the force that is created by the heat dissipation device on the motherboard to minimize load conditions that could damage the motherboard. The bolster plate is invented for reinforcing the motherboard.

Presently, the type of motherboard is shifting from Advanced Technology Extended (ATX) specification towards Balanced Technology Extended (BTX) specification. The arrangement of standard bores of an ATX motherboard, through which a plurality of posts of a bolster plate pass to install a heat dissipation device, is different from the arrangement of standard bores of a BTX motherboard. Thus a bolster plate for an ATX motherboard does not fit a BTX motherboard, and the need to redesign the bolster plate for a BTX motherboard increases design and manufacturing costs.

What is desired, therefore, is to provide a bolster plate assembly which can fit a variety of motherboards.

SUMMARY

An exemplary bolster plate assembly for a printed circuit board includes a first structure member, a second structure member rotatably mounted to the first structure member, and a plurality of locking members. Two spaced, elongated sliding slots are defined in the first structure member. Two spaced, elongated sliding slots are defined in the second structure member. The locking members are slidably attached in the sliding slots of the first and second structure members.

Other advantages and novel features of the present invention will become more apparent from the following detailed description of an embodiment when taken in conjunction with the accompanying drawings, in which:

BRIEF DESCRIPTION OF THE DRAWINGS

FIG. 5 shows a use state of the bolster plate assembly of FIG. 3, for attaching a heat dissipation device to another printed circuit board.

DETAILED DESCRIPTION

Figure 1:
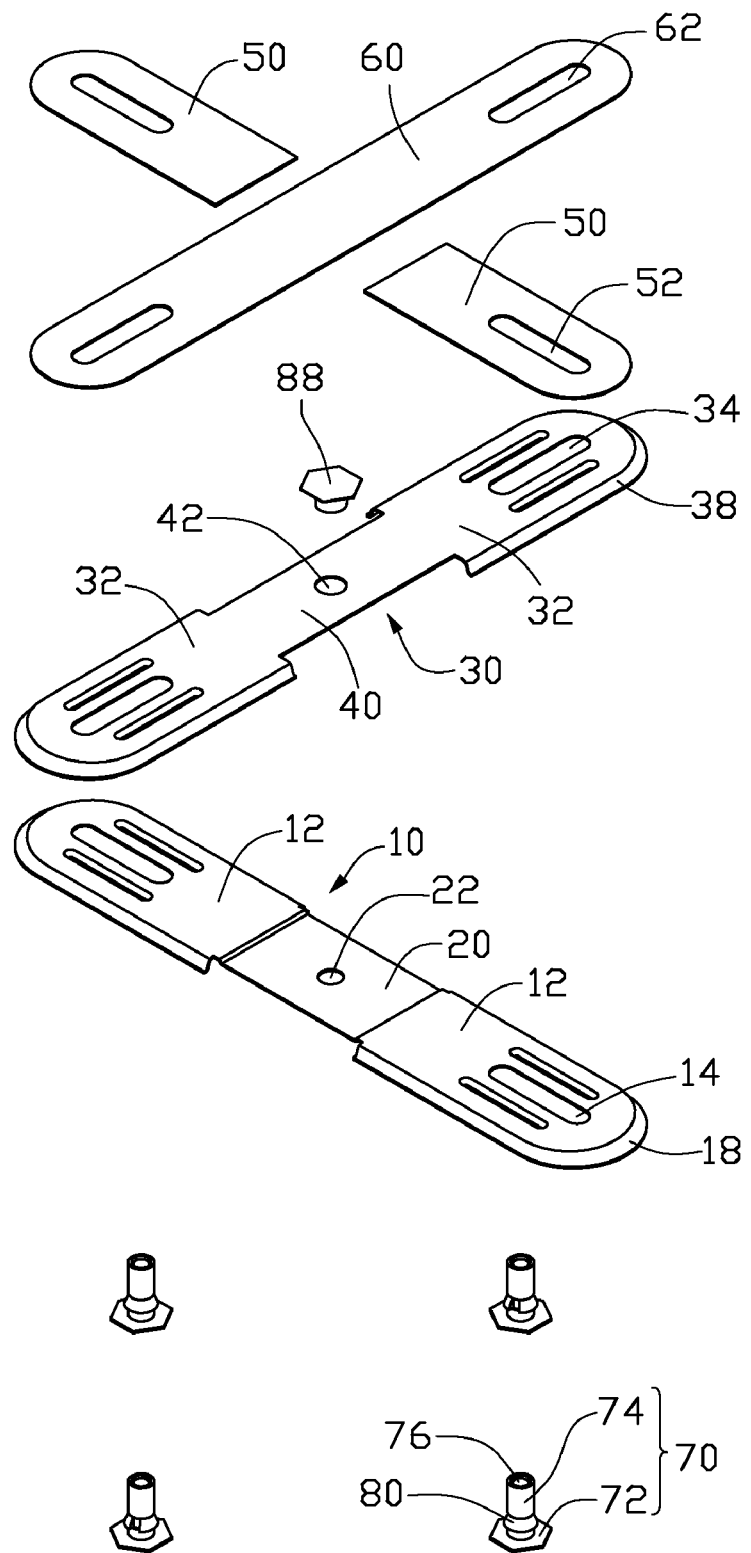
FIG. 1 is an exploded, isometric view of a bolster plate assembly for a printed circuit board according to an embodiment.
Figure 2:
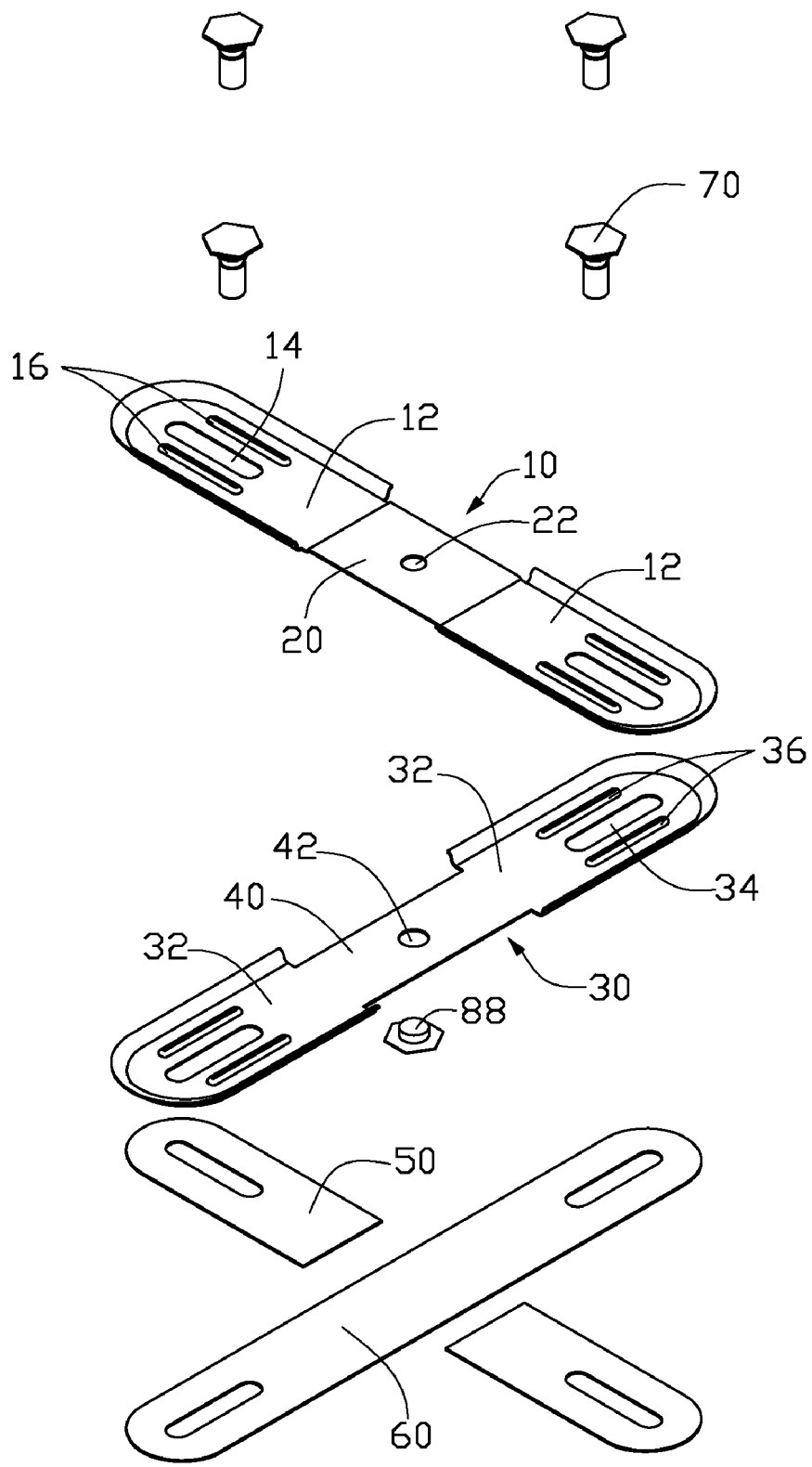
FIG. 2 is an inverted view of FIG. 1.

Referring to FIGS. 1 and 2, in an embodiment, a bolster plate assembly for a printed circuit board includes a first structure member 10, a second structure member 30, two first nonconductive pads 50, a second nonconductive pad 60, a plurality of locking members 70, and a plurality of retaining members 80 detachably mounted to the locking members 70.

The first and second structure members 10, 30 are elongated parts. The first structure member 10 includes two end portions 12 and a coupling portion 20 integrally connecting with the two end portions 12. The first structure member 10 is depressed downwardly to form the coupling portion 20 between the end portions 12 thereof. A through hole 22 is defined in the center of the coupling portion 20 of the first structure member 10. An elongated sliding slot 14 is defined in each end portion 12 of the first structure member 10 extending along the extending direction of the first structure member 10. Two elongated raised ridges 16 are formed on an underside of each end portion 12 of the first structure member 10, located adjacent and parallel to the corresponding sliding slot 14 of the end portion 12 of the first structure member 10. Each sliding slot 14 of the second structure member 10 is located between the corresponding two raised ridges 16 thereof. Two depending skirts 18 are downwardly bent along circumferences of the two end portions 12 of the first structure member 10 respectively.

The second structure member 30 includes two end portions 32 and a coupling portion 40 integrally connecting with the end portions 32. A through hole 42 is defined in the center of the coupling portion 40 of the second structure member 30. An elongated sliding slot 34 is defined in each end portion 32 of the second structure member 30 extending along the extending direction of the second structure member 30. Two elongated raised ridges 36 are formed on an underside of each end portion 32 of the second structure member 30, located adjacent and parallel to the corresponding sliding slot 34 of the end portion 32 of the second structure member 30. Each sliding slot 34 of the second structure member 30 is located between the corresponding two raised ridges 36 thereof. Two depending skirts 38 are downwardly bent along circumferences of the two end portions 32 of the second structure member 30 respectively.

The sizes of the first nonconductive pads 50 respectively correspond to the end portions 12 of the first structure member 10 and are to be glued on the end portions 12 of the first structure member 10. An elongated aligning slot 52 is defined in each first nonconductive pad 50 corresponding to the corresponding sliding slot 14 of the first structure member 10. The size of the second nonconductive pad 60 corresponds to the second structure member 30 and is to be glued on the second structure member 30. Two elongated aligning slots 62 are defined in two ends of the second nonconductive pad 60 corresponding to the two sliding slots 34 of the second structure member 30 respectively.

Each locking member 70 includes a flattened hexagonal head 72 and a post 74 extending from the head 72. A mounting hole 76 is defined in the post 74 of the locking member 70. Each retaining member 80 is a ring-shaped resilient part with a gap defined therethrough. Each retaining member 80 is formed with a beveled surface. The retaining members 80 are snappingly held on the posts 74 of the locking members 70 via the gaps thereof.

Figure 3:
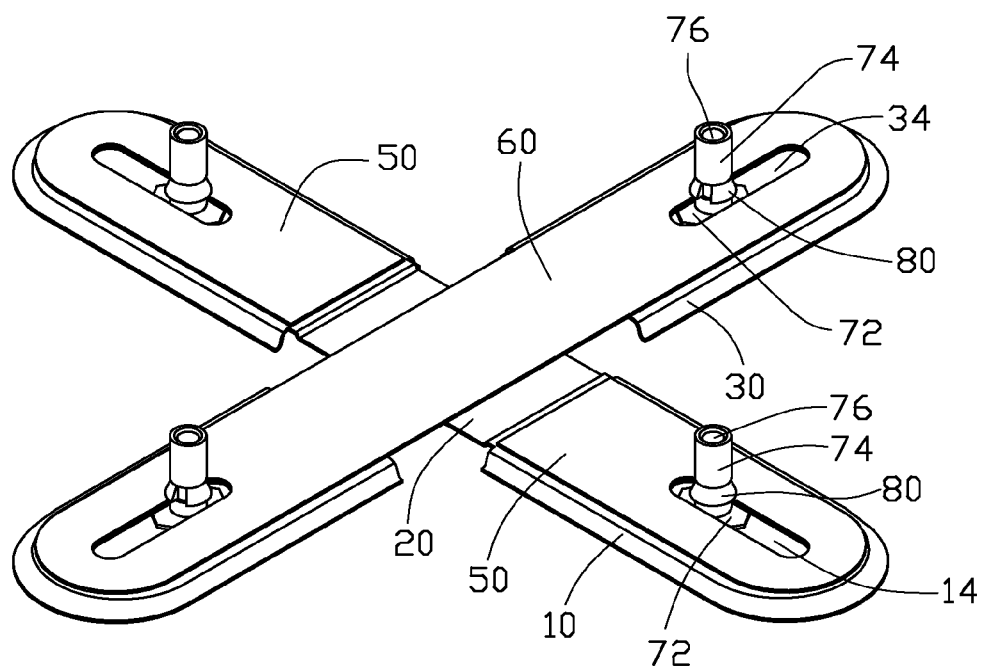
FIG. 3 is an assembled view of FIG. 1.

Referring also to FIG. 3, in assembly, the second structure member 30 is crossed over the first structure member 10, and the through hole 42 of the second structure member 30 is aligned with the through hole 22 of the first structure member 10. A connecting member such as a rivet 88 is inserted in the two through holes 42, 22 and is riveted. Thus the first and second structure members 10, 30 are rotatably combined together. The first nonconductive pads 50 are glued on the end portions 12 of the first structure member 10, and the aligning slots 52 of the nonconductive pads 50 are respectively aligned with the sliding slots 14 of the first structure member 10. The second nonconductive pad 60 is glued on the second structure member 30, and the aligning slots 62 of the second nonconductive pad 60 are respectively aligned with the sliding slots 34 of the second structure member 30. The posts 74 of the locking members 70 are inserted through the sliding slots 14, 34 of the first and second structure member 10, 30. The heads 72 of the locking members 70 are pressed and the retaining members 80 are resiliently deformed by edges of the sliding slots 14, 34, when the retaining members 80 are passed through the corresponding sliding slots 14, 34. The beveled surfaces of the retaining members 80 facilitate the retaining members 80 passing through the corresponding sliding slots 14, 34. The locking members 70 are slidably mounted in the sliding slots 14, 34 of the first and second structure members 10, 30 via the edges of the sliding slots 14, 34 being sandwiched between the retaining members 80 and the corresponding heads 72 of the locking members 70. Thus the bolster plate assembly is completely assembled.

Figure 4:
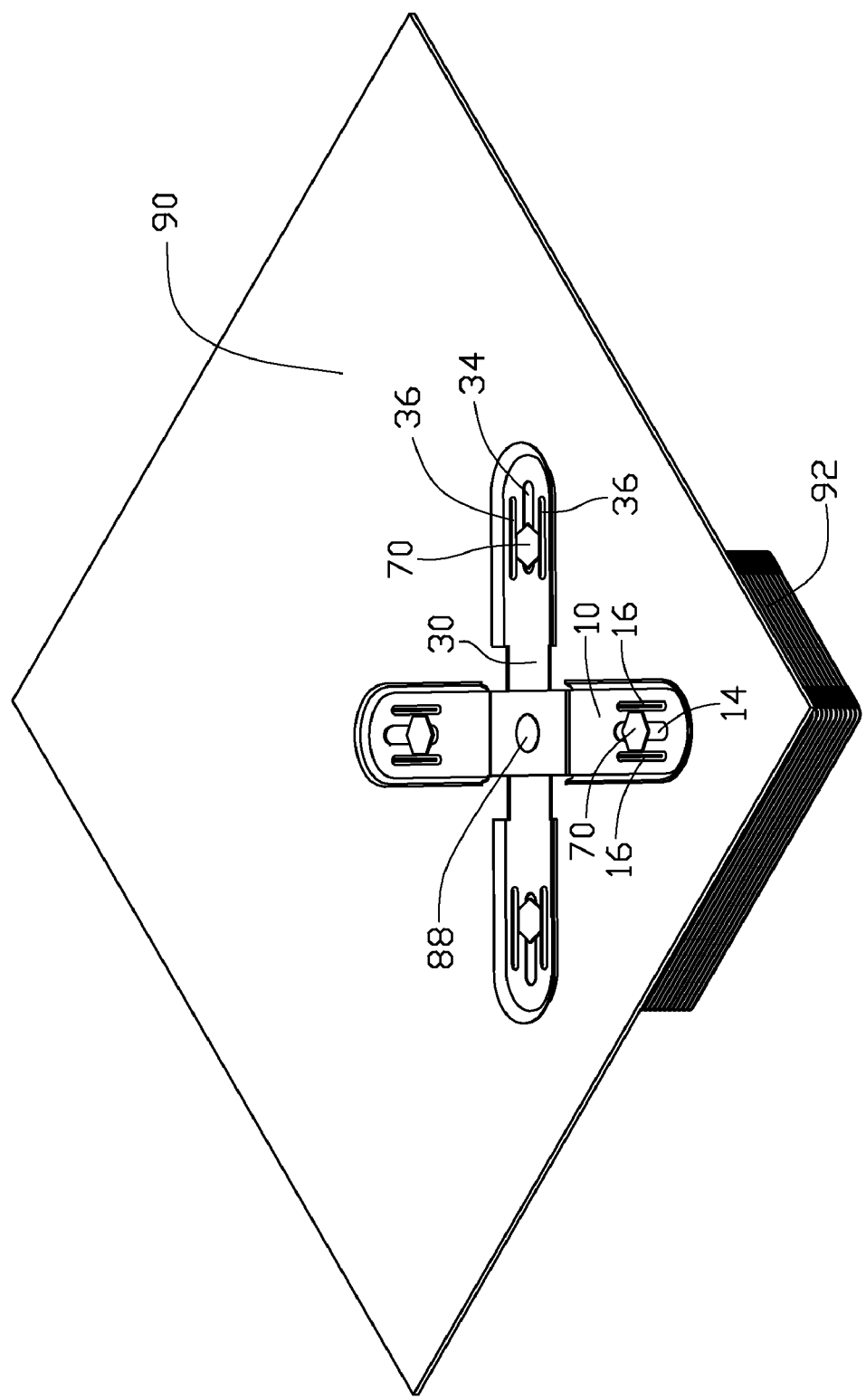
FIG. 4 shows a use state of the bolster plate assembly of FIG. 3, for attaching a heat dissipation device to a printed circuit board.

Referring also to FIG. 4, in use, the first and second structure members 10, 30 of the bolster plate assembly are rotated relative to each other, and the locking members 70 are slidably adjusted in the corresponding sliding slots 14, 34 of the first and second structure members 10, 30. The posts 74 of the locking members 70 are aligned with standard bores of an ATX motherboard 90 and are passed through the standard bores of the ATX motherboard 90. When the retaining members 80 abut on circular peripheries of the standard bores of the ATX motherboard 90, the heads 72 of the locking members 70 are pressed, or the ATX motherboard 90 is pressed, the retaining members 80 are resiliently deformed and passed through the standard holes of the ATX motherboard 90. The retaining members 80 resiliently recover and abut against circular peripheries of the standard holes of the ATX motherboard 90, and the bolster plate assembly is attached to the ATX motherboard 90. The bolster plate assembly is generally cross-shaped in profile. The heads 72 of the locking members 70 are located at the ends of the sliding slots 14, 34, adjacent the center of the bolster plate assembly. The first and second nonconductive pads 50, 60 can insulate the first and second structure members 10, 30 from the ATX motherboard 90. A plurality of fasteners, such as spring loaded screws, of a supporting frame of a heat dissipation device, such as a heat sink 92, is screwed into the mounting holes 76 of the locking members 70. Thus the heat sink 92 is firmly secured to the ATX motherboard 90.

Referring also to FIG. 5, the first and second structure members 10, 30 of the bolster plate assembly are rotated relative to each other and the locking members 70 are slidably adjusted in the corresponding sliding slots 14, 34 of the first and second structure members 10, 30. The posts 74 of the locking members 70 are aligned with standard bores of a BTX motherboard 96 and are passed through the standard bores of the BTX motherboard 96. The bolster plate assembly is secured to the BTX motherboard 96 via the retaining members 80 of the locking members 70 abutting against circular peripheries of the standard holes of the BTX motherboard 96. The bolster plate assembly is generally fork-shaped in profile. The heads 72 of the locking members 70 are located at the other ends of the corresponding sliding slots 14, 34. A plurality of fasteners of a supporting frame of a heat dissipation device, such as a heat sink 98, is installed into the mounting holes 76 of the locking members 70. Thus the heat sink 98 is firmly secured to the BTX motherboard 90.

The bolster plate assembly can be applied to motherboards of other types via the rotation of the first and second structure members 10, 30 relative to each other and the slide of the locking members 70 in the corresponding sliding slots 14, 34. If the first and second structure members 10, 30 of the bolster plate assembly are made of nonconductive material, the first and second nonconductive pads 50, 60 can be removed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A bolster plate assembly for a printed circuit board, comprising:
   a first structure member defining two spaced, elongated sliding slots therein;
   a second structure member rotatably mounted to the first structure member, two spaced, elongated sliding slots being defined in the second structure member; and
   a plurality of locking members slidably attached in the sliding slots of the first and second structure members.

2. The bolster plate assembly as described in claim 1, wherein each of the locking members comprises a head and a post extending from the head, and a plurality of retaining members is held on the posts of the locking members for attaching the locking members in the sliding slots of the first and second structure members.

3. The bolster plate assembly as described in claim 2, wherein two elongated raised ridges are formed on the first structure member adjacent each of the sliding slots thereof, and the heads of the locking members, slidably attached in the sliding slots of the first structure member, are located between the corresponding elongated raised ridges.

4. The bolster plate assembly as described in claim 3, wherein the raised ridges of the first structure members are parallel to the corresponding sliding slot thereof.

5. The bolster plate assembly as described in claim 2, wherein two elongated raised ridges are formed on the second structure member adjacent each of the sliding slots thereof, and the heads of the locking members, slidably attached in the sliding slots of the second structure member, are located between the corresponding elongated raised ridges.

6. The bolster plate assembly as described in claim 5, wherein the raised ridges of the second structure members are parallel to the corresponding sliding slot thereof.

7. The bolster plate assembly as described in claim 1, wherein a through hole is defined in the first structure member between the two sliding slots, a through hole is defined in the second structure member between the two sliding slots, and the first and second structure members are rotatably installed together via a connecting member passing through the two through holes.

8. The bolster plate assembly as described in claim 7, wherein the first structure member comprises two end portions and a coupling portion connecting with the end portions, the two sliding slots of the first structure member are respectively defined in the end portions, and the through hole thereof is defined in the coupling portion.

9. The bolster plate assembly as described in claim 7, wherein the second structure member comprises two end portions and a coupling portion connecting with the end portions, the two sliding slots of the second structure member are respectively defined in the end portions, and the through hole thereof is defined in the coupling portion.

10. The bolster plate assembly as described in claim 2, wherein a mounting hole is defined in each of the posts of the locking members configured for receiving a fastener.

11. A thermal module comprising:
a printed circuit board;
a heat dissipation device positioned at a surface of the printed circuit board; and
a bolster plate assembly positioned at the other surface of the printed circuit board, comprising:
a first structure member defining two spaced, elongated sliding slots therein;
a second structure member rotatably mounted to the first structure member, two spaced, elongated sliding slots being defined in the second structure member; and
a plurality of locking members slidably attached in the sliding slots of the first and second structure members;
wherein the locking members are adjusted in the corresponding sliding slots to pass through the printed circuit board for securing the heat dissipation device to the printed circuit board.

12. The thermal module as described in claim 11, wherein a through hole is defined in the first structure member between the two sliding slots, a through hole is defined in the second structure member between the two sliding slots, and the first and second structure members are rotatably installed via a connecting member passing through the two through holes.

13. The thermal module as described in claim 11, wherein each of the locking members comprises a head and a post extending from the head, and a plurality of retaining members is held on the posts to sandwich the printed circuit board with the corresponding heads thereby attaching the bolster plate assembly to the printed circuit board.

14. The thermal module as described in claim 13, wherein two elongated raised ridges are formed on the first structure member adjacent each of the sliding slots thereof, two elongated raised ridges are formed on the second structure member adjacent each of the sliding slots thereof, and the heads of the locking members are located between the corresponding raised ridges.

15. The thermal module as described in claim 11, wherein a plurality of nonconductive pads is glued on the first and second structure members configured for insulating the first and second structure members from the printed circuit board.

* * * * *